United States Patent [19]

Penzel

[11] 4,394,753

[45] Jul. 19, 1983

[54] INTEGRATED MEMORY MODULE HAVING SELECTABLE OPERATING FUNCTIONS

[75] Inventor: Hans-Joerg Penzel, Wolfratshausen, Fed. Rep. of Germany

[73] Assignee: Siemens Aktiengesellschaft, Berlin & Munich, Fed. Rep. of Germany

[21] Appl. No.: 206,133

[22] Filed: Nov. 12, 1980

[30] Foreign Application Priority Data

Nov. 29, 1979 [DE] Fed. Rep. of Germany ....... 2948159

[51] Int. Cl.$^3$ .............................................. G11C 7/00
[52] U.S. Cl. .................................... 365/236; 365/200
[58] Field of Search ................ 365/200, 230, 231, 236

[56] References Cited

U.S. PATENT DOCUMENTS 3,755,791  8/1973  Arzubi ................................ 365/200

OTHER PUBLICATIONS

Memory Data Book and Designers Guide, Mostek Corp. Feb. 1978, pp. 107–122.
Littmann, H., "Continuing Miniaturization," HMD, Data Carriers, Electronic Memories, Sep. 1979 (89) 8/3/8, sheets 1–3.

Primary Examiner—Joseph A. Popek

[57] ABSTRACT

An integrated memory module has operating functions which are selectable even after the module has been built-in. A significant expansion of the possibilities of use of the memory module is achieved by the introduction of an inscribable and readable mode register for the acceptance of control information for defining the desired operating function, by the expansion of the address inputs into bidirectional module interfaces, and by the subdivision of the memory medium which is constructed as a matrix into n areas of identical size which are simultaneously addressable with the most significant portion of the column address. An internal address counter also permits accesses with consecutive column addresses given constant row address.

3 Claims, 5 Drawing Figures

INTEGRATED MEMORY MODULE HAVING SELECTABLE OPERATING FUNCTIONS

BACKGROUND OF THE INVENTION

1. Field of the Invention

The present invention relates to a memory module, and more particularly to an integrated memory module having memory cells arranged in a matrix and addressable by row and column addresses, in which a plurality of address input terminals are provided for receiving the address signals, an address buffer memory is connected to the input terminals for receiving an address with a row address decoder and a column address decoder for forming row and column selection signals, and in which a data input and a data output are provided.

2. Description of the Prior Art

Integrated memory modules for the construction of write/read memories having random access have respectively undergone a four-fold increase of memory capacity in recent years. At present, 16 Kbit modules are generally available (cf., for example, Memory Data Book and Designers Guide, Mostek Corp., Carollton, Tex., February 1978, pp. 107–122) and 65 Kbit modules are in the testing stage. Also, 262 Kbit modules are under preparation.

All known memory modules of the type under consideration here exhibit a data interface which is 1 bit wide. The length of the addresses increases with the increase in memory capacity. In order to save pins, one has had recourse to subdividing the overall address into two parts in accordance with the internal module row and column address and to input the two parts in succession by way of the same terminal pins. Address acceptance, relaying to the internal address decoder, and activation of internal clock series then occurs by corresponding, chronologically shifted transfer signals.

The increase of the memory capacity of the individual memory modules also produces a considerable reduction of the specific space requirement and of the access time for the memories constructed of such modules. Since, on the other hand, the minimum capacity of a memory with respect to memory words is equal to its capacity in bits because of the 1 bit wide data interface of the memory modules, the continuing increase of the memory capacity of the memory modules of necessity leads to memory sizes which are undesired in many cases such as, for example use thereof in conjunction with microprocessors or as microprogram buffer memories.

SUMMARY OF THE INVENTION

The object of the present invention, therefore, is to provide additional installations in highly-integrated memory modules so that the memory modules can be adapted to various cases of use even after their fabrication and given complete compatibility with conventionally-designed memory modules.

According to the invention, such a memory module features, in the type of memory briefly set forth above, a mode register which is charged or read by way of the address input terminals for receiving information defining the operating function of the memory module, devices for address input and data input and output which are designed for bidirectional operation, a memory medium which is subdivided into n areas respectively encompassing an identical plurality of columns with simultaneous access to such areas, and a switch circuit which is connected to the address buffer memory for selective, partially bidirectional connection of the address buffer memory to the address decoders, to the mode register, and to the internal data bus, whereby the n lines of the data bus are identical to the write/read lines of the memory cells preselected by a higher value portion of the column address.

By the above features of the invention, it is possible to execute the following read and write operations as a function of the information stored in the mode register: 1 bit, 4 parallel, 8 or respectively, 9 bit parallel, as well as, given constant row address, a plurality of bits in succession with random column addresses and, finally, 2, 4 or 8 accesses in succession given constant row address and consecutive column addresses, whereby each access can optionally comprise 1 bit or 8, respectively, 9 bits simultaneously. By so doing, a multiple of specific memory modules can be replaced by a single type of module. The required circuit expansion requires little additional chip surface.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
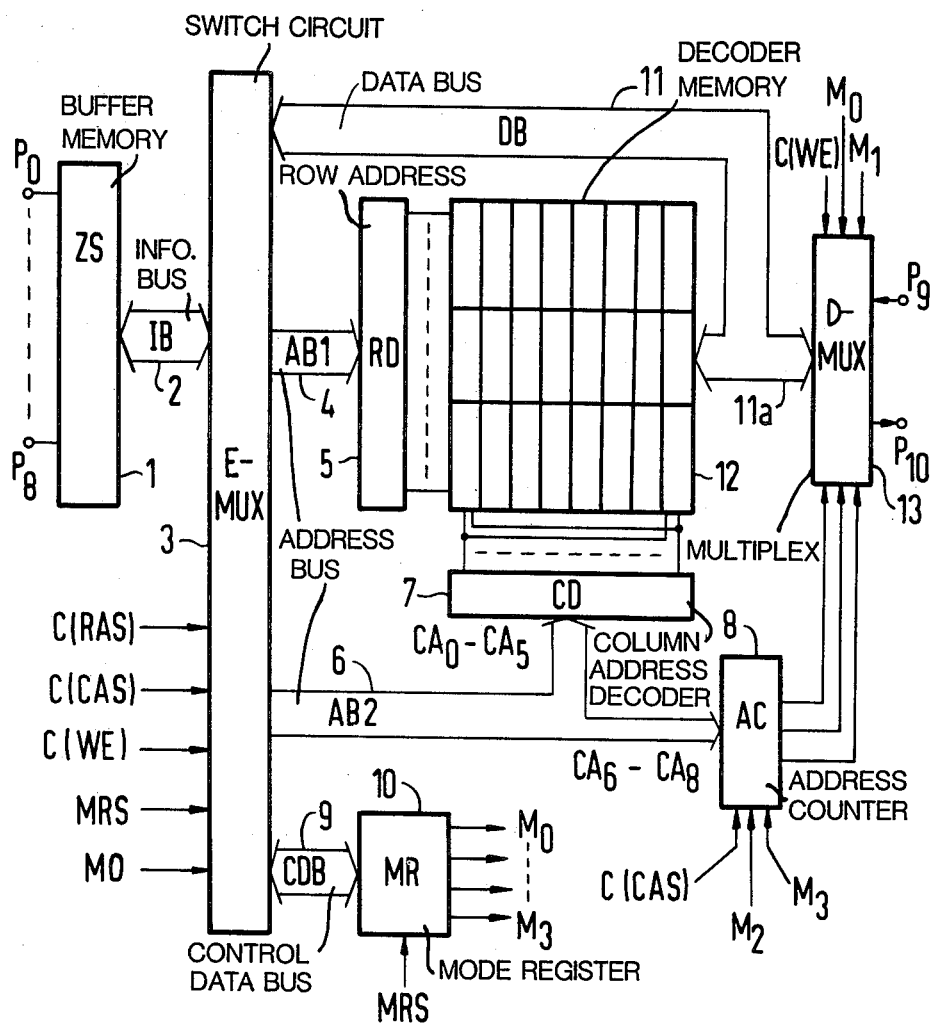
FIG. 1 is a schematic diagram of a first exemplary embodiment of the invention of a memory module having shown those circuit elements which are essential for an understanding of the invention.

Referring to FIG. 1, an overview of the essential circuit elements of a memory module constructed in accordance with a first exemplary embodiment of the invention is shown. The illustration and the following description are based on a memory capacity of 262 Kbit, for which reason the memory field contains 512 rows and columns. For specific purposes, which shall be discussed below, the increase in the number of columns to 576 can be advantageous. The general organization of the memory module, apart from the characteristic features provided by the present invention, corresponds to the organization of a known 16,384×1 bit memory module MK 4116 set forth in the above-mentioned publication of the Mostek Corp.

According to FIG. 1, a buffer memory 1 (ZS) is connected to a plurality of terminals $P_0-P_8$, the buffer memory 1 corresponding with respect to the address input to the address buffer of the known memory module. In contrast thereto, however, the buffer memory 1 is designed in such a manner that it allows both the input and the output of the information into or, respectively, out of the memory module by way of the pins $P_0-P_8$.

An information bus 2 (IB) extends from the buffer memory 1 to a switch circuit 3 (E-MUX). The switch circuit 3 is also partially designed for reversible traffic. The switch circuit 3 selectively connects the information bus 2 by way of a first address bus 4 (AB1) to a row address decoder 5 (RD), by way of a second address bus 6 (AB2) to a column address decoder 7 (CD) for the six more significant address bits ($CA_0$–$CA_5$) and to an address counter 8 (AC) for the three less significant bits ($CA_6$–$CA_8$), via a control data bus 9 (CDB) to mode register 10 (MR) for the acceptance of control data for defining the operating mode of the memory module 10 and, finally, to a data bus 11 (DB).

The control of the switch circuit 3 occurs by a plurality of signals. The signals C(RAS), C($\overline{CAS}$) and C(WE) are derived froom the strobe signal $\overline{RAS}$ for the row address, from the strobe signal $\overline{CAS}$ for the column address, and from the write/read selection signal $\overline{WE}$. The siganal MRS effects an access to the mode register 10 and the signal M1 is a part of the control information stored in the mode register 10 whose significance shall be set forth below. The signal MRS has priority over the signals $\overline{RAS}$ and $\overline{CAS}$ with respect to the control of the switch circuit 3.

In a known manner, the row address decoder 5, in accordance with the actual row address, selects one of the 512 rows of the memory field 12. According to FIG. 1, the memory field 12 comprises an upper half and a lower half, with read and regenerative amplifiers located therebetween. The data input and output occurs by way of a data bus whose one branch 11, as already mentioned, extends to the switch circuit or multiplexer 3 and whose other branch 11a terminates at a multiplexer 13 (D-MUX).

The memory field 12, for example, is subdivided into eight areas of 64 columns each. All areas are simultaneously addressable. Therefore, the column address decoder 7 is designed in such a manner that it selects one column in each area.

The control data input into the mode register 10 are expediently subdivided into two groups of two bits each. The first group with the bits $M_0$ and $M_1$ then determines, for example, the width of the data interface of the memory module and the second group with the bits $M_2$ and $M_3$ indicates the plurality of write or read accesses with consecutive row addresses which are referenced below as chained accesses.

The following significance can then be assigned, for example, to the bit groups:

| $M_0$ | $M_1$ | Data interface |
|---|---|---|
| 0 | 0 | 1 bit |
| 1 | 0 | 4 bits |
| 1 | 1 | 8 (9) bits |
| $M_2$ | $M_3$ | Chained accesses |
| 0 | 0 | No chaining |
| 0 | 1 | 2 accesses |
| 1 | 0 | 4 accesses |
| 1 | 1 | 8 accesses |

Conventional operating modes such as write, read, read-modify-write, and accesses having varible column addresses given constant row addresses via a 1-bit interface (page mode) are therefore possible for $M_0=M_1=M_2=M_3=0$.

An interface 9 bits wide is available by way of the terminal pins $P_0$–$P_8$ for an external access to the mode register. It is therefore advantageous to expand the mode register 10 to 9 positions and, of the control information to be additionally incorporated, to employ, for example, two bits $M_4$ and $M_5$ for the control of internal test sequences and to employ the remaining bits $M_6$–$M_8$ in a manner known per se for the organization of equivalent circuits of defective memory areas (cf. HMD, September 1979 (89), 8/3/8, sheets 1–3). The register portion containing the bits $M_6$–$M_8$ is advantageously executed as a programmable read-only memory which is already inscribed before the fabrication of the memory module. Therefore, its contents can later only be read. Fundamentally, it is also possible to increase the capacity of the mode register to a multiple of 9 bits, for example, to 18 bits. In this case, another mode register address must be offered which is received into the module with the signal RAS when the signal MRS is simultaneously applied. However, this shall be not discussed in greater detail.

Given non-chained memory accesses ($M_2=M_3=0$), the address counter 8 operates as a standard register for temporary storage of the portion of the column address which comprises the bits $CA_6$–$CA_8$. The input occurs by means of the aforementioned, internally-generated signal pulse C(CAS). Given chained accesses, the respectively valid partial address, proceeding from the originally-input starting address, is successively increased by one with each further pulse C (CAS). The limits of the address increase are defined by the control bit $M_2$ and $M_3$ in the mode register. To this end, a four-stage pulse counter (not illustrated) is assigned to the address counter 8, the pulse counter being pre-set to the binary value 0010, 0100 or 1000 encoded by means of the control bit $M_2$ and $M_3$ and counted back step-by-step by the signal pulses C (CAS) until the counter reading 0000 is attained. Another possibility resides in setting a three-stage pulse counter to the initial value 111 by the signal C (RAS) and to count up past the counte 000 up to the binary value, for example, 001 or 011 or 111, reduced by one which is defined by the control bit $M_2$ and $M_3$. Attainment of the respectively prescribed final value is identified by a comparator.

The multiplexer 13, which is connected to the write-/read lines in the memory field 12 by way of the data bus 11 or, respectively, 11a has the job of executing various circuit switching and temporary storage functions in accordance with that portion of the column address located in the address counter 8 and as a function of the control data in the mode register 10. To this end, the address bits $CA_6$–$CA_8$ from the column address counter 8 and the bits $M_0$ and $M_1$ from the mode register 10 are supplied to the multiplexer 13 as control magnitudes. A signal C(WE) derived from the write/read selection signal $\overline{WE}$ defines the transmission direction.

Figure 2:
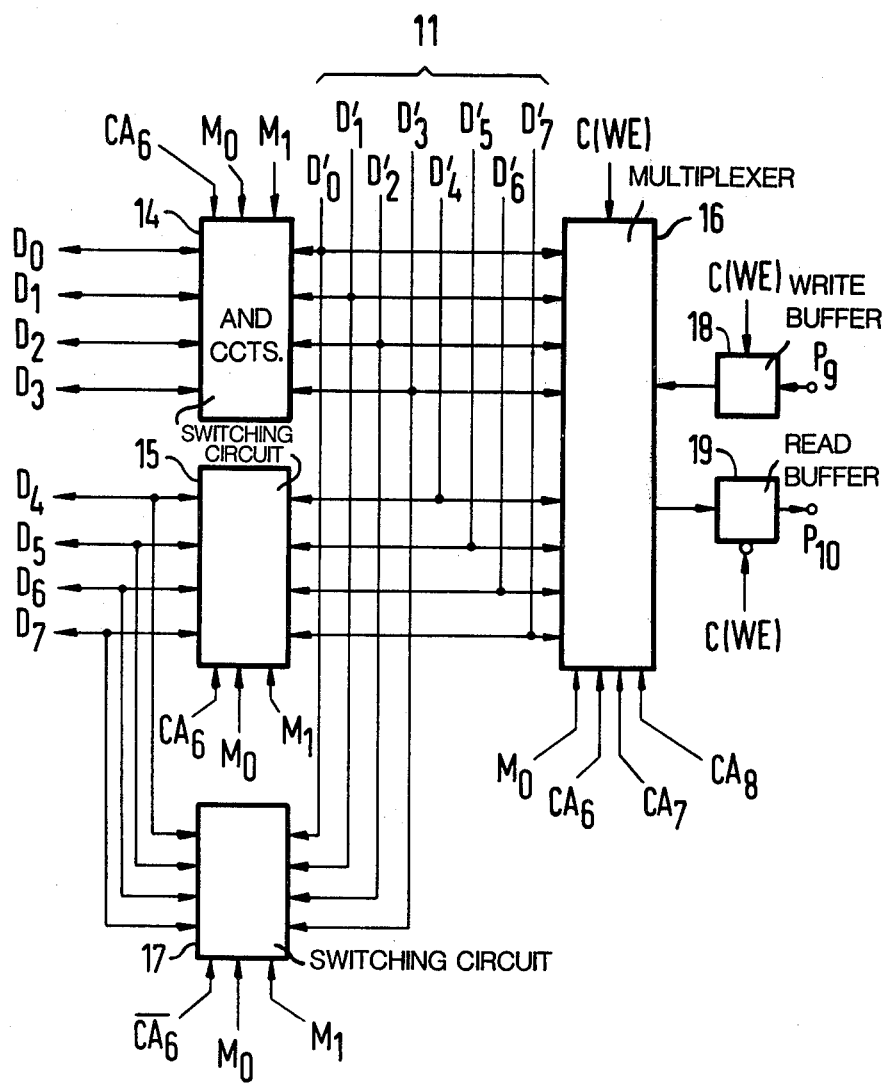
FIG. 2 is a schematic illustration of the details of a multiplexer of FIG. 1.

Details of the multiplexer 13 are illustrated in FIG. 2. In FIG. 2, 8 data lines $D_0$–$D_7$ produce the connection to the read amplifiers or, respectively, write lines, selected by the higher value bits $CA_0$–$CA_5$ of the column address. A first circuit 14 for bidirectional operation comprising AND circuits through-connects the data lines $D_0$–$D_3$ to the data lines $D'_0$–$D'_3$ when the logical relationship $\overline{CA_6} \cdot M_1 + \overline{M_0} + \overline{M_1}$ is met. The signal C (WE) defines the transmission direction. The through-connection of the data lines $D_4$–$D_7$ occurs with the assistance of a second switching circuit 15. It becomes conductive given fulfillment of the logical relationship $\overline{CA_6} \cdot M_0 \cdot M_1 + \overline{M_0} + \overline{M_1}$. The data lines $D'_0$–$D'_7$ are connected to a multiplexer 16 and also form the aforementioned data bus 11 (FIG. 1).

A third switching circuit 17, which is designed like the first and second switching circuits 14 and 15, blocks or produces the following connections of the data lines: $D_4$ to $D'_0$, $D_5$ to $D'_1$, $D_6$ to $D'_2$ and $D_7$ to $D'_3$ when the logical relationship $CA_6 \cdot M_0 \cdot \overline{M_1}$ is met. The signal C(WE) again defines the transmission direction.

The switching circuit, therefore, serves for switching between a data interface which is 4 bits wide and a data interface which is 8 bits wide via the terminal pins $P_0-P_3$ or, respectively, $P_0-P_7$. The switching circuits 14, 15 and 17 can be eliminated if one foregoes a 4 bit data interface. Instead of an 8 bit data interface, a 9 bit data interface can also be formed when the memory field 12 is subdivided into 9 independent, addressable areas given appropriate adaptation of the column address decoder 7. In this case, for example, an increase of the plurality of columns to 576 is advantageous. The appertaining data line $D_8$ (not illustrated on the drawing) bypasses the aforementioned switching circuits.

The multiplexer 16, whose transmission direction again depends on the signal C(WE), is activated by the signal $M_0$ from the mode register 10. Depending on the respective combination of the address bit $CA_6-CA_8$, the multiplexer 16 through-connects one of the data lines $D'_0-D'_7$ to the pin $P_9$ via the write buffer 18 or to the pin $P_{10}$ via the read buffer 19.

Figure 3:
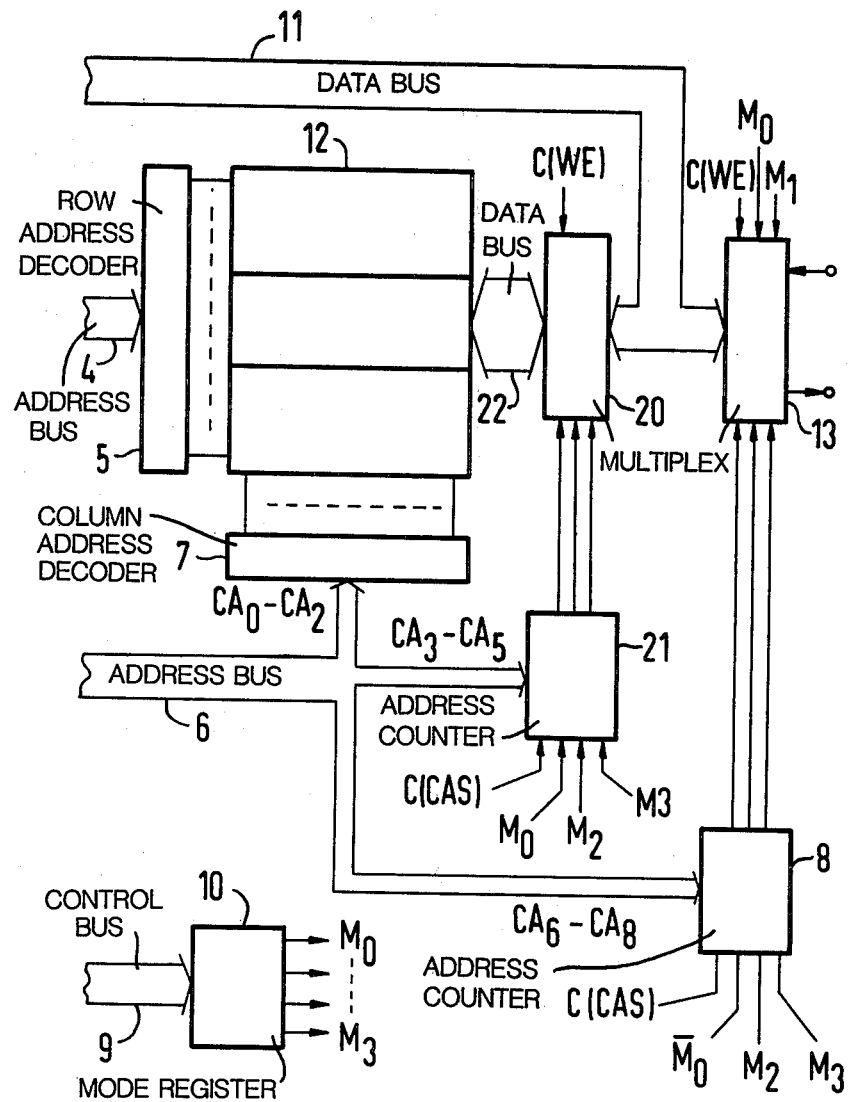
FIG. 3 is a schematic representation of a second exemplary embodiment of the invention.

FIG. 3 illustrates a further exemplary embodiment of the invention in which, for the sake of simplicity, the buffer memory 1 and the switching circuit 3 (FIG. 1) are not illustrated on the drawing. With this exemplary embodiment, in addition to the operating modes discussed above, it is also possible to execute chained accesses with 8 bits in parallel. To this end, a further multiplexer 20 for bidirectional operation is inserted between the memory 12 and the multiplexer 13 (cf. FIG. 2 as well). The multiplexer 20 is controlled by the respectively current reading of a second address counter 21. The signal C(WE) again defines the conductive direction.

The memory field is now subdivided into $8 \times 8 = 64$ simultaneously addressable areas which, given 512 columns, would respectively comprise 8 columns. Accordingly, the data bus 22 between the memory field 12 and the multiplexer 20 exhibits 64 lines. According to the actual column partial address supplied by the second address counter 21, the multiplexer 20 selects 8 data bits from the 64 offered data bits or through-connects 8 data bits to 8 to 64 lines on the data bus.

The second address counter 21 must be executed with respect to three places for the control of the multiplexer 20. The column partial address comprising the bits $CA_3-CA_5$ is input into the second address counter 21 by the signal C(RAS). Only the address bits $CA_0-CA_2$ then continue to be applied at the correspondingly modified column address decoder 7.

In order to distinguish between chained accesses with respectively 1 bit and those as have 8 bits in parallel, the control bit $M_0$ or $M_1$ in the mode register can be employed. Therefore, for example, given the bit $M_0=1$, chained accesses occur by way of the 8 bit data interface when at least one of the further control bits $M_2$ or $M_3$ simultaneously has the logical value "1". In this case, the second address counter 21 is forwarded step-by-step by the signal pulses C(CAS), whereby the plurality of counting steps is again defined by the control bits $M_2$ and $M_3$. Thereby, due to $\overline{M_0}=0$, the first address counter 8 is prevented from modifying the input, lower value addresses $CA_6-CA_8$.

In detail, the second address counter 21 operates in the same manner as the first address counter 8. The pulse counter orignally allocated to the first address counter 8 can be employed for defining the counting limits.

Instead of chained accesses with respectively 8 bits, chained accesses with 9 bits can also be provided. It is also possible to design the module for chained accesses with 4 bits each. In this case, the address bit $CA_6$ must be involved in the counting. Fundamentally, an execution for chained accesses with selectively 4 or 8 bits is possible at the same time.

Let it also be pointed out that such outputs of circuit elements as are connected to bidirectionally employed lines must always be high-resistance when the appertaining circuit elements are blocked by their control signals to the relaying of signals.

Figure 4:
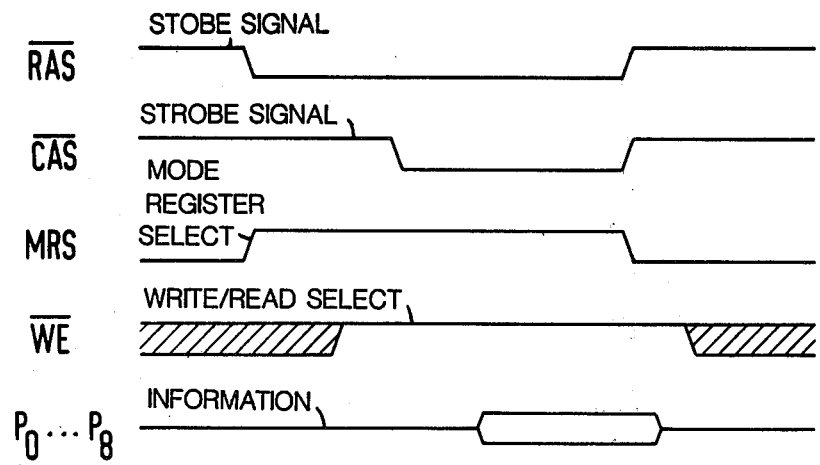
FIG. 4 is a pulse diagram for a read operation of the mode register.

FIG. 4 illustrates the temporal course of the signals which become effective at the periphery of the memory module upon reading of the mode register 10. These are the signals $\overline{RAS}$ and $\overline{CAS}$, the signal MRS which selects the mode register 10 by means of a corresponding route control in the switch circuit 3 and has priority over the signals $\overline{RAS}$ and $\overline{CAS}$ in this regard, the write/read selection signal $\overline{WE}$, and the information at the pins $P_0-P_8$, read from the mode register 10. Any random signal level is admissible in the shaded areas in the course of the signal $\overline{WE}$. The lines in the last line proceeding at half the signal level are meant to signify high-resistant outputs. A low signal level of the signal $\overline{WE}$ simultaneously with the high level of the signal MRS would result in a write cycle. Whereby, however, given the preconditions mentioned above for the register occupation, only the control information applied to the pins $P_0-P_5$ could be entered.

Figure 5:
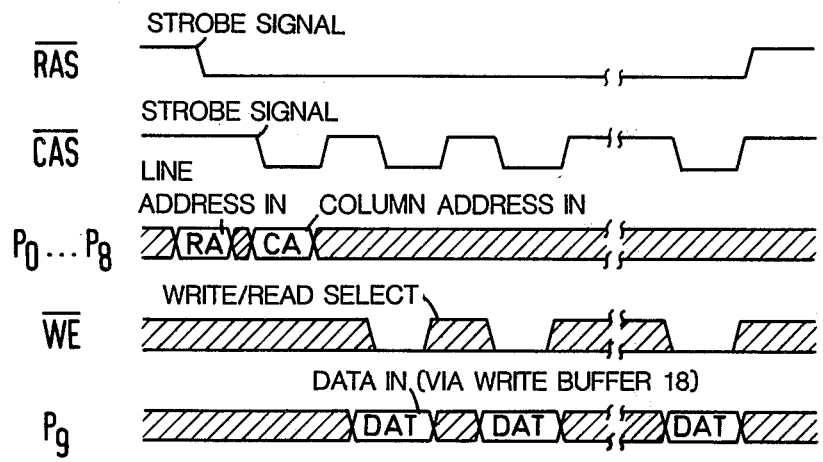
FIG. 5 is a pulse diagram for writing with continous column addresses.

The temporal course of signals given writing with consecutive column addresses and constant line address is illustrated in FIG. 5. With the shift of the strobe signal $\overline{RAS}$ to the low signal level, corresponding to a logical "0", the line address RA first applied at the pins $P_0-P_8$ is received and relayed to the row address decoder RD. Shortly thereafter, the strobe signal $\overline{CAS}$ shifts the low signal level and thus indicates the acceptance of the column address CA which is now offered. The strobe signal $\overline{CAS}$ then again shifts into the high signal level. The first negative pulse of the strobe signal $\overline{CAS}$ also effects the acceptance of the three low value bits $CA_6-CA_8$ into the address counter 8. The actual row address therefore, serves as the starting address for the following memory access, which are respectively only triggered by means of further, negative pulses of the strobe signal $\overline{CAS}$. At the same time, the second and the following negative pulses of the acceptance signal $\overline{CAS}$ cause the step-by-step increase of the counter reading of the address counter 8 and, therefore, of the partial address consisting of the address bits $CA_6-CA_8$.

The fourth line in FIG. 5 illustrates the course of the write/read selection signal $\overline{WE}$. Negative pulses of the signals $\overline{WE}$ which approximately chronologically coincide with the second and the following negative pulses of the strobe signal $\overline{CAS}$ result in the fact that the bit DAT applied to the terminal pin $P_g$ of the memory module is inscribed.

Null negative pulses of the signal $\overline{WE}$ would effect read operations. In this case, the read bits would be applied at the terminal pin $P_{10}$ with a chronological offset corresponding to the access time.

An additional peripheral connection is required for the control signal MRS necessary for the control of the access to the mode register 10. Given a module housing having terminal pins arranged in two rows (dual-in-line package), that can result in an increase of the number of terminal pins by two in comparison to an otherwise identical module execution without additionally selectable operation functions. For example, an 18 pin housing would have to be employed instead of a 16 pin housing. Therewith, however, such a memory module could no longer be interchanged without further ado for a memory module of conventional design, although full compatibility exists in other respects. However, it is also possible to incorporate a memory chip designed according to the invention in a housing with 16 pins when the terminal for the control signal MRS is applied internally of the module to a suitable fixed potential, to a potential corresponding to logical "0" in the case of the exemplary embodiments described. Of course, the possibility of selecting additional operating modes is then lost.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In an integrated memory module of the type in which a plurality of memory cells are arranged in a matrix of columns and rows and are addressable by row and column addresses received via a plurality of address terminals in response to strobe signals to provide data on a plurality of write/read lines, in which a bidirectional address buffer is connected to the address terminals for receiving an address, and in which a row address decoder and a column address decoder are connected between the address buffer and the rows and columns of memory cells, respectively, for producing row and column selection signals, the improvement therein comprising:

a data bus connected to said memory and having a plurality of lines equal to the number n of write/-read lines to be selected by a higher value portion of a column address;

a mode register operable to receive and store mode signals from and to provide mode signals for the address terminals, the mode signals defining the operating functions of the memory module, in response to predetermined control signals;

a bidirectional data input and data output device connected to said data bus;

said memory matrix divided into small n areas each including an identical plurality of columns of memory cells and all said areas being simultaneously accessible; and a switch circuit, including a bidirectional operating portion, and selectively operable to connect the address buffer to the address decoders, to connect the address buffer to the mode register and to connect the address register to the data bus in response to receipt of other control signals including the strobe signals.

2. The improved memory module of claim 1, and further comprising:

an address memory connected to said switch circuit for receiving the lower value bits of a column address and column address strobe signals and operable to change the counter output signals step-by-step for a predetermined number of and in response to receipt of column address strobe signals; and said data input and data output device including a multiplexer connected to said address counter and to said data bus, said multiplexer including a data input and a data output and operable in response to the counter output signals to selectively connect either said data input or said data output to one of n memory cells selected by a row address and the higher value bits of a column address.

3. The improved memory module of claim 2, and further comprising:

a further multiplexer interposed between the memory matrix and said data bus; and a further address counter connected between said switch circuit and said further multiplexer for receiving a plurality of mean significant bits of a column address and operable to count, alternatively to the counting by the first-mentioned address counter, step-by-step in response to receipt of column strobe signals to modify the received portion of the column address, said matrix being further divided into k subareas of equal size which are simultaneously addressable by the highest value bits of a column adddress, said further multiplexer operable to connect said data bus and respectively k write/read lines of one of the n areas of the memory matrix.

* * * * *